United States Patent [19]

DeFreez et al.

[11] Patent Number: 4,796,269
[45] Date of Patent: Jan. 3, 1989

[54] TWO-DIMENSIONAL PHASE-LOCKED SURFACE EMITTING SEMICONDUCTOR LASER ARRAY

[75] Inventors: Richard K. DeFreez, Hillsboro; Richard A. Elliott; Joseph Puretz, both of Beaverton, all of Oreg.

[73] Assignee: Oregon Graduate Center, Beaverton, Oreg.

[21] Appl. No.: 53,697

[22] Filed: May 22, 1987

[51] Int. Cl.[4] .............................................. H01S 3/19
[52] U.S. Cl. ...................................... 372/50; 372/45; 372/48; 372/108; 357/17
[58] Field of Search ...................... 372/50, 45, 46, 48, 372/18, 19, 108; 357/17

[56] References Cited

U.S. PATENT DOCUMENTS 4,581,744  4/1986  Takamiya et al. ..................... 372/50

OTHER PUBLICATIONS (Anonymous), "RCA Laboratories Develops Surface-Emitting Diode Laser," *Lasers & Applications,* vol. 5, No. 11, Nov. 1986, pp. 18, 20.
Chow, "Two-Dimensional Phase-Locked Laser Array," National Technical Information Service (U.S. Dept. of Comm.), publication date unknown.
Evans et al., "Surface-Emitting Second Order Distributed Bragg Reflector Laser with Dynamic Wavelength Stabilization and Far-Field Angle of 0.25°," *Applied Physics Letters,* vol. 49, No. 6, Aug. 11, 1986, pp. 314–315.
Yang et al., "Surface-Emitting GaAlAs/GaAs Linear Laser Arrays with Etched Mirrors," *Applied Physics Letters,* vol. 49, No. 18, Nov. 3, 1986, pp. 1138–1139.

*Primary Examiner*—William L. Sikes
*Assistant Examiner*—Georgia Y. Epps
*Attorney, Agent, or Firm*—Kolisch, Hartwell & Dickinson

[57] ABSTRACT

A coherent, two-dimensional, phase-locked, surface emitting semiconductor laser array in a monolithic wafer is disclosed. Active regions of diode laser-striped semiconductor material are focused ion beam (FIB) micromachined to form transversely disposed channels of symmetric, opposed, generally parabolic, mirrored surfaces. Multiple diode laser pairs, emitting laser energy in a generally horizontal plane, are longitudinally injection-coupled (phase-locked) by semitransmissive, opposed regions that are micromachined into the otherwise reflective parabolic surfaces of each channel. Inherently, the striped material permits evanescent coupling, in an axis generally perpendicular to the longitudinal, injection-coupled axis. Thus, coupling is achieved in two dimensions across the extent of the array. High-power, coherent, laser energy is reflected thereby generally normally away from the surface of the monolithic structure. In a modification to the preferred embodiment, discrete electrodes on the top surface of the active region segments enable laser beam modulation or wavelength tuning of the coherent, surface emitting laser energy.

7 Claims, 1 Drawing Sheet

TWO-DIMENSIONAL PHASE-LOCKED SURFACE EMITTING SEMICONDUCTOR LASER ARRAY

BACKGROUND AND SUMMARY OF THE INVENTION

This invention relates generally to coherent, surface emitting, semiconductor laser arrays. More particularly, the invention relates to the fabrication of two-dimensional phase-locked, surface emitting semiconductor laser arrays in a monolithic wafer.

The potential for monolithic integration of two-dimensional laser arrays has stimulated the investigation of various means of forming semiconductor lasers that emit laser energy normal to the plane of the wafer. Two general types of surface emitting lasers are known to have been constructed. One has a short oscillator cavity perpendicular to the plane of the wafer and the other has its oscillator cavity in the plane of the wafer with emission normal to the surface being accomplished by a turning mirror or a distributed Bragg reflector in the surface of the wafer. Further, investigation of means for forming diode lasers that are simultaneously surface emitting and two dimensionally coupled has been stimulated by the potential of coupling several monolithically formed diode lasers together to enable tuning all to a single wavelength, to promote phase-locking for spatially coherent emission and to provide high power outputs. A structure to accomplish two-dimensional coupling and surface emission is proposed by the present invention.

Turning mirrors have been successfully fabricated in the surface of semiconductor materials, e.g., GaAs, AlGaAs, by chemical etching, mass transport, ion-milling, and ion-beam assisted etching. Focused ion beam (FIB) micromachining of integrated optical structures recently has been reported. The FIB micromachining of high-quality optical surfaces to create low threshold diode lasers, coupled-cavity lasers and surface emitting diode lasers is described in our copending application Ser. No. 858,357, entitled "Focused Ion Beam Micromachining of Optical Surfaces in Materials", filed May 1, 1986, and now U.S. Pat. No. 4,698,129, and in our published reports entitled "Focused-Ion Beam Micromachined AlGaAs Semiconductor Laser Mirrors," *Electronics Letters*, Vol. 22, No. 13, pp. 700–702 (1986); "CW Operation of Widely and Continuously Tunable Micromachined-Coupled-Cavity Diode Lasers," *Electronics Letters*, Vol. 22, No. 17, pp. 919–921 (1986); and "300 mW Operation of a Surface Emitting Phase-Locked Array of Diode Lasers," *Electronics Letters*, Vol. 23, No. 3, pp. 130–131 (1987), all of which are incorporated herein by this reference.

Optical-quality FIB micromachining makes possible the preparation of intricately curved semiconductor laser surfaces, such as parabolic turning mirrors, as well as other structures required for wafer scale monolithic integration. One such structure, found to have particularly useful surface emitting and injection-coupling features, is proposed by the present invention.

Diode lasers are typically manufactured from a wafer consisting of, for example, a GaAs substrate on which layers of AlGaAs and GaAs have been grown epitaxially to form a p-n junction and an optical waveguide. The waveguide serves to confine the radiation emitted by recombining electrons and holes at the p-n junction to a thin layer in the plane of the wafer. Long, narrow laser cavities, e.g., 1×4×300 μm, are formed by restricting the light laterally by either a lateral waveguide, in the case of index-guided lasers, or by confining the current carriers laterally, in the case of gain-guided lasers. The laser oscillator mirrors which define the longitudinal dimension of a diode laser are conventionally formed by cleaving the wafer crystal perpendicular to the laterally confining feature, be it an optical waveguide or a high-current, high-gain stripe.

By micromachining a vertical output mirror and a 45° planar turning mirror perpendicular to a high-gain stripe, the laser energy which would otherwise be emitted in the plane of the substrate and in the direction of the stripe (longitudinal), may be reflected in a direction generally normal to the surface of the wafer.

Planar mirrors are not an ideal geometry for reflecting laser energy normal to the surface. This is because the light wave emerging from the vertical emitting region within the monolithic structure is not planar, but rather is strongly divergent. A parabolic, mirrored surface located at twice the parabola's focal length from an emitting region will ideally redirect all incident laser energy normally away from the surface in a diffraction-limited beam. If channels having symmetric, thus-located parabolic sections are micromachined into the surface of the diode laser wafer perpendicular to the stripe thereof, then laser energy from adjacent emitting regions incident upon either parabolic surface will be reflected normal to the surface of the array. By injecting laser energy from an emitting region on one side of the channel to the emitting region on the other side of the channel, the stripes that are interrupted by the channels may be longitudinally injection coupled to one another.

It is desirable to provide a surface emitting semiconductor laser that takes advantage of the well-known lateral evanescent coupling of multiple stripe arrays and that also takes advantage of the longitudinal, injection-coupled laser diode pairs described immediately above. The combination of these two coupling structures makes possible the realization of two-dimensional, phase-locked, surface emitting, semiconductor laser arrays of greatly increased coherent output power.

Accordingly, it is an object of this invention to provide a coherent, phase-locked, two-dimensional, surface emitting semiconductor laser array in a monolithic substrate.

Another object is to provide such an array that is compatible with known micromachining processes.

Yet another object of the present invention is to provide a laser array that makes use of conventional diode laser materials.

In the preferred embodiment of the present invention, FIB micromachining enables the preparation of such channels in the surface of multiple stripe diode laser wafer material to produce a two-dimensionally coherent, surface emitting semiconductor laser array in a monolithic structure having a plurality of longitudinally injection-coupled and laterally evanescently coupled lasers therein. The surface emitting and injection coupling geometries are well-defined and highly controlled by the FIB micromachining process, and enable the production of high-power, low divergence outputs. The injection coupling of adjacent emitting regions is accomplished by insubstantially interrupting the reflective, parabolic surfaces with dual channel-lengthwise, semi-transmissive regions located opposite dual emitting regions. These opposing, injection coupling surfaces act as conduits for laser energy to pass through, thus longitudinally coupling adjacent laser columns, while insubstantially interrupting the reflective, parabolic surfaces that give rise to surface-normal emission.

These and other objects and advantages of the present invention will be more clearly understood from a consideration of the drawings and the following description of the preferred embodiment.

DETAILED DESCRIPTION OF THE PREFERRED EMBODIMENT

Figure 1:
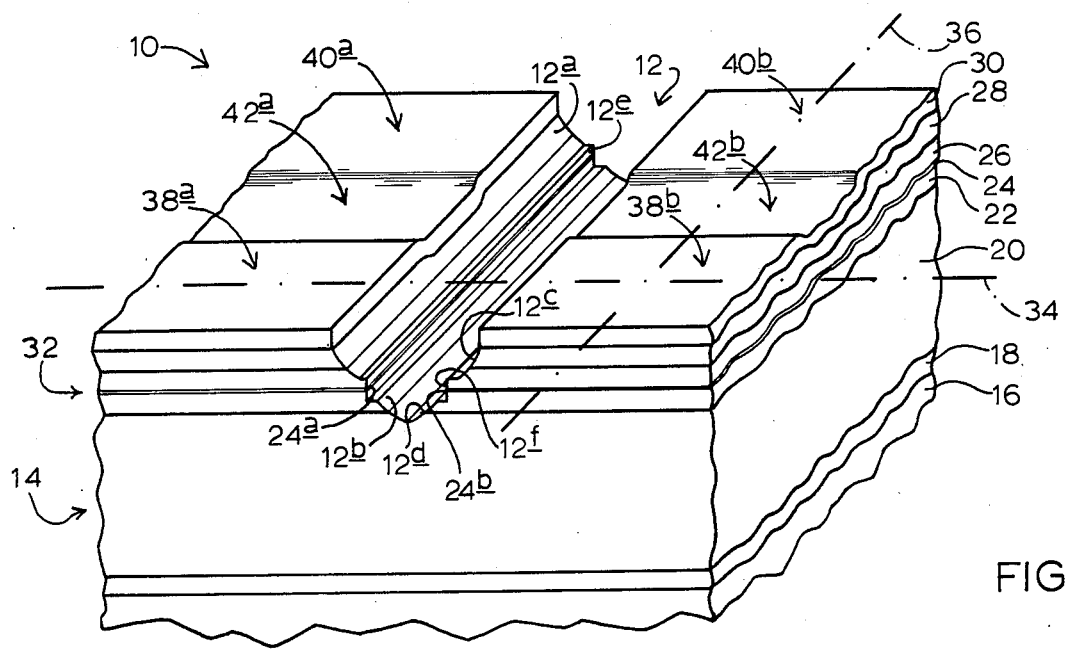
FIG. 1 shows, in fragmentary perspective view, a two-dimensional diode laser array fabricated in accordance with the preferred embodiment of the invention.

Referring first to FIG. 1, a two-dimensional semiconductor diode laser array, fabricated in accordance with the preferred embodiment of the invention, is indicated generally at 10. Laser array 10 is fabricated by micromachining a channel 12 into commercially available laser material 14. Material 14 comprises various layers: a bottom layer of heat sink material 16 (shown fragmentarily); common electrode 18; n-type, preferably GaAs, substrate 20; first cladding layer 22 of n-type material, such as AlGaAs; an undoped GaAs layer defining an active region 24; a second cladding layer 26 of p-type material, such as AlGaAs; a top semiconductor layer 28, preferably of GaAs; and a top electrode 30. Layers 22, 24, 26, 28, 30 are collectively referred to as monolithic surface 32 of material 14. It is generally within this surface that channel 12 is formed by FIB micromachining. The generally planar interface within material 14 between layers 28, 30 is referred to herein as an emission surface.

Channel 12 is oriented generally perpendicular to longitudinal axis 34, and the formation thereof in surface 32 forms pairs of adjacent, spaced laser means 38a, 38b, and 40a, 40b. Active region 24 is, by the preparation of channel 12, divided into regions 24a, 24b, each capable of emitting laser energy generally parallel with axis 34 and generally toward one another. This important feature, and the geometry and dimension of channel 12, give rise to longitudinal coupling between laser means 38a, 38b, and between laser means 40a, 40b, while permitting reflection of some of the laser energy incident upon channel 12 in a direction perpendicular to surface 32. Laser means 38a, 38b may be thought of as a row of lasers that, by the inherent evanescent coupling between the stripes of material 14 generally parallel with axis 36, are evanescently coupled to adjacent row of lasers 40a, 40b. Channel 12 forms, in surface 32, what may be thought of as adjacent columns of coupled lasers consisting, in the illustration, of laser means 38a, 40a, and laser means 38b, 40b.

Coupling-directing means, or optical-quality surfaces 12a, 12b, 12c, 12d, 12e, 12f within channel 12 are, by their geometry and dimension, capable of phase-locking adjacent laser columns, and redirecting energy emitted from active region 24 generally normally away from surface 32. Means for directing the laser energy normally away from surface 32, or a reflective region of channel 12 comprising optical-quality surfaces 12a, 12b, 12c, 12d, has converging sloping walls in the cross-sectional shape of parabolic arcs, as will be described in more detail, in reference to FIG. 2. These optical-quality surfaces enable the efficient reflection of incident laser energy therefrom. Optical-quality surfaces 12e, 12f define facing transmissive regions within channel 12, and provide means for coupling longitudinally adjacent active regions 24a, 24b of adjacent laser columns, thereby permitting the injection-coupled phase locking thereof. In the preferred embodiment of the invention, surfaces 12e, 12f represent approximately twenty percent of the total surface area of channel 12, insubstantially interrupting the reflective surfaces therein.

Insulating regions such as 42a, 42b are formed by the selective proton implantation thereof by conventional photolithographic and masking techniques, thereby disrupting the crystal structure of layer 28 and decreasing its conductivity. The masking and etching processes typically produce the three-dimensional surface effect illustrated in FIG. 1.

It will be understood by those skilled in the art that any three semiconductor lasers, such as 38a, 38b, 40b, distributed in two dimensions (as viewed normal to surface 32) form a two-dimensional, surface emitting semiconductor laser array, by virtue of injection coupling within rows (along axis 34), and by virtue of evanescent coupling within columns (along axis 36). Noncollinear axes 34 and 36, which lie generally in the plane of the substrate, represent coupling axes along which laser pair 38a, 38b and laser pair 38b, 40b are phase-locked to produce coherent surface emission.

In the preferred embodiment, and by the generally perpendicular orientation of channel 12 relative to the stripes of material 14, coupling axes 34, 36 are at a substantially right angle to one another. It will be appreciated that plural injection-coupled laser pairs may extend along axis 34 to the extent of material 14, with plural channels, such as 12, providing the novel coupling-directing means. Similarly, it will be appreciated that plural evanescently coupled laser pairs inherently extend along axis 36 to the extent of material 14, with plural insulating regions, such as 42a, 42b, interposing evanescently coupled pairs therealong. One such arrangement of plural channels 12 in material 14, capable of producing a highpower, coherent, two-dimensional laser array, will be described in reference to FIG. 3.

Figure 2:
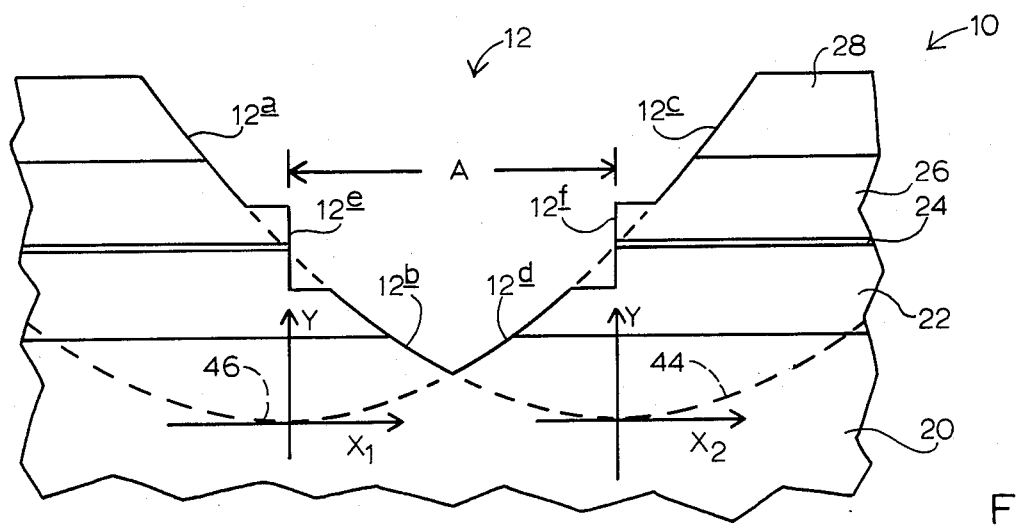
FIG. 2 shows, in schematic form, the detailed cross-sectional geometry of the preferred embodiment.

Turning now to FIG. 2, the detailed cross-sectional geometry of channel 12 is illustrated. Omitted from this fragmentary view, for the sake of clarity, is upper electrode 30. Surfaces 12a, 12b are seen to represent arcs of a parabola 44 described by the equation $y = x_2^2/4f$, where y represents the ordinate, $x_2$ represents the abscissa and f represents the focal length of parabola 44. Complementarily, surfaces 12c, 12d represent arcs of a parabola 46 described by the equation $y = x_1^2/4f$, where y represents the ordinate, $x_1$ represents the abscissa and f represents the focal length of parabola 46. Thus, channel 12 will be seen as having a uniform cross section that may be described as the obtuse intersection of two concavely confronting parabolic arcs.

Importantly, the origins of the Cartesian coordinate systems represented by $(x_1, y)$ and $(x_2, y)$ are separated by distance A of twice the parabolas' focal length f. This relationship results in the placement of transmissive regions 12e, 12f at the focal point of opposite mirrored surfaces, each of which describes a parabola. In other words, surfaces 12a, 12b generally describe a parabola whose focal point is the center of transmissive region 12f, and surfaces 12c, 12d generally describe a parabola whose focal point is the center of transmissive region 12e. It will be appreciated by those skilled in the art that this novel structure ensures nearly ideal reflection from parabolic surfaces 12a, 12b; and 12c, 12d of incident laser energy exiting active regions 12f, and 12e, respectively, in a direction normal to the plane of active region 24. In cooperation with active region 24, semi-transmissive regions 12e, 12f act as what may be thought of as an injection conduit, enabling the injection coupling of laser means 38a, 38b and laser means 40a, 40b (refer to FIG. 1). Transmissive regions 12e, 12f are, in the preferred embodiment, generally parallel planar with one another, and are, in cross section, generally coaxial with the generally parallel, surface-normal axes of parabolas 46, 44. In the preferred embodiment, regions 12e, 12f are located, relative to the emission surface, at approximately one-half the depth of channel 12.

Figure 3:
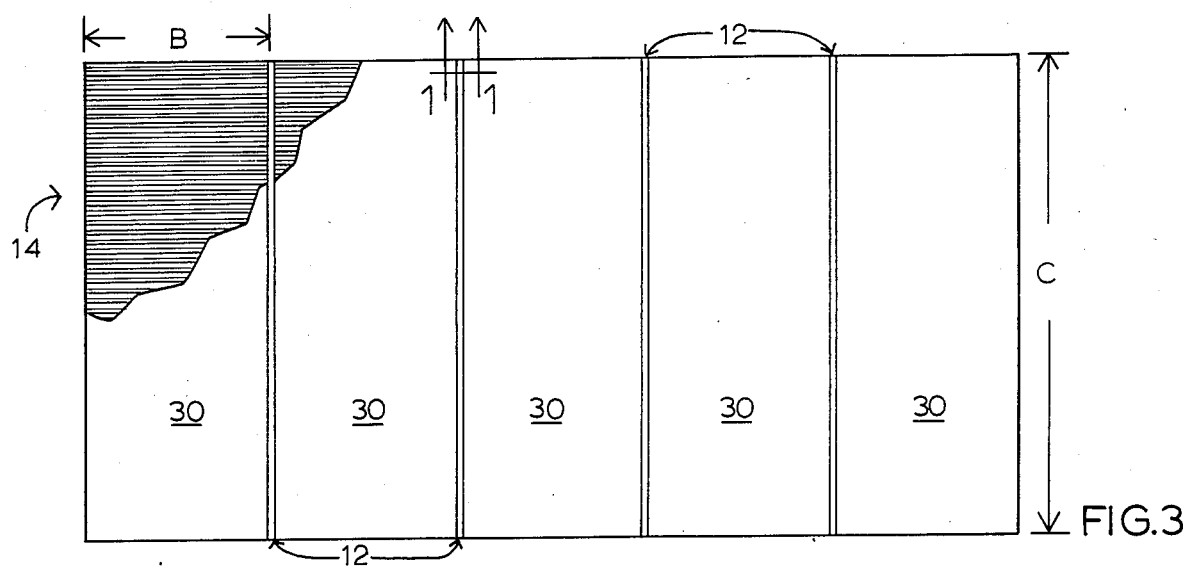
FIG. 3 shows, in a top view, a plan layout of a semiconductor device fabricated as contemplated by the invention.

Turning now to FIG. 3, a top view of the planned layout of plural channels, such as 12, within material 14 is shown. For the sake of clarity, bonding pads, which may extend perimetrically about the array in any well-known manner, are not shown in this plan view. It will be appreciated that the application of power to electrodes, such as 30, and the grounding of common electrode 18 (see FIG. 1) may be accomplished by well-known lead bonding and packaging techniques.

It will be seen that, in this planned layout, top electrode 30 is continuous within each column of lasers, such as 38b, 40b of FIG. 1. In this embodiment, therefore, operation of the two-dimensional, surface emitting laser array may be obtained by the simultaneous (continuous or pulsed) application of power to electrodes 30 in each column. In the array shown, each channel 12 is separated from another by a distance B, or approximately 200 μm, rendering the length of the array approximately 1000 μm. The width C of such a laser array is approximately 500 μm. In cut-away view under top electrodes 30, the striped surface of material 14 is shown schematically, for reference purposes. Not shown, for the sake of clarity in this plan view, are the three-dimensional surface features illustrated in FIG. 1, which extend across the surface of wafer material 14. For scale and reference purposes, it is noted that FIG. 1 is taken generally along the lines 1—1 in FIG. 3.

It will be appreciated by those skilled in the art that the farfield pattern of such a semiconductor laser array may be improved by increasing the array's fill factor, or the number of channels per unit length. Nevertheless, there is an upper limit to the number of channels, such as 12, that may be productively formed along material 14. This is because, as the number of channels per unit length is increased, the optical waveguide cavities injection coupled thereby are shortened. In the extreme, their lengths may be reduced below the optimum length for efficient operation. In other words, the design of an array involves optimization, rather than maximization, of fill factor. Such factors as cost of manufacture and ease of fabrication, lead bonding and packaging may militate against the desirability of increasing the fill factor. A channel separation distance B of approximately 200 μm is compatible with presently available techniques and materials. Obviously, within the spirit of the invention, an array of any desirable fill factor may be fabricated.

The two-dimensional laser array of FIG. 3, having 250 active elements of 10 mW each, is capable of producing 2.5 W of output power at an emission wavelength of 800 nm (8000 angstroms) in a low divergence beam. It will be appreciated that other two-dimensional array geometries may be equally suitable, and are within the spirit of the invention.

In a proposed modification to the preferred embodiment, one or more top electrodes may be segmented, or fragmented, so that power may be selectively applied to the active regions therebeneath. Such selective application of power to various segments of the monolithic laser array enables laser beam modulation or wavelength tuning, which is desirable in certain applications. Laser beam modulation or tuning are also possible without segmenting an electrode, such as 30, within a given column of evanescently coupled lasers. For example, modulated electrical power may be applied in common to all electrodes 30 to provide beam modulation; or electrical power may be applied in common to electrodes in the two left-most and the two right-most columns in FIG. 3, while variable electrical power is applied independently to the center column, to provide wavelength tuning.

The numerous advantages of the present invention should be apparent to those skilled in the art. The formation, in a monolithic substrate of laser material, of evanescently coupled rows of injection-coupled columns of laser pairs, by FIB micromachining plural channels in the surface thereof, is capable of producing high-power, coherent, two-dimensional, phase-locked surface emitting semiconductor laser arrays. Laser energy emitted into parabolically reflective channel regions substantially is reflected generally normally away from the surface of the substrate, while laser energy emitted into insubstantially interruptive, transmissive channel regions injection couples adjacent columns.

Accordingly, while a preferred embodiment of the invention and a modification thereof have been described herein, it is appreciated that further modifications are possible that come within the scope of the invention.

It is claimed and desired to secure by Letters Patent:

1. A two-dimensional, coherent, surface emitting, semiconductor laser array in a wafer having an emission surface comprising:
   at least three semiconductor lasers arrayed in two dimensions as viewed along an axis which is generally normal to said surface, each laser including plural semiconductor layers which form an oscillator cavity generally in the plane of said wafer and each laser including electrode means for energizing said cavity to emit energy of a predefined wavelength from said cavity;
   means for phase locking said lasers during operation of said array; and
   means for reflecting a portion of said energy generally normal to and away from said surface.

2. A two-dimensional, coherent, surface emitting semiconductor laser array in a wafer having an emission surface comprising:
   at least three semiconductor lasers, each including plural semiconductor layers which form an oscillator cavity generally in the plane of said wafer and each including electrode means for energizing said cavity to emit energy of a predefined wavelength from said cavity, said lasers being pair-wise phase lockable in at least two non-collinear coupling axes lying generally in said plane, and means for reflecting a portion of said energy generally normal to and away from said surface.

3. The array of claim 2, wherein said coupling axes are generally perpendicular to one another.

4. A two-dimensional coherent, surface emitting semiconductor laser array in a wafer having an emission surface comprising:
a plurality of adjacent rows of evanescently coupled semiconductor lasers, each laser including plural semiconductor layers which form an oscillator cavity generally in the plane of said wafer and each laser including electrode means for energizing said cavity to emit energy of a predefined wavelength from said cavity, said rows being interruped by plural elongate channels prepared in and extending generally in the plane of said surface to form adjacent columns of said coupled lasers
coupling-directing means within each of said channels capable of phase locking adjacent columns of lasers and redirecting energy from said lasers generally normal to and away from said surface.

5. The array of claim 4, wherein said channels extend generally perpendicular to said rows.

6. The array of claim 5, wherein each of said coupling-directing means comprises a reflective region of the associated channel, each of said regions having converging sloping walls having surfaces that substantially reflect such energy.

7. The array of claim 6, wherein said coupling-directing means further comprises dual, facing transmissive regions, associated with said reflective regions, each of said transmissive regions being formed in one of said sloping walls, with each of said transmissive regions insubstantially interrupting the associated reflective region to permit injection-coupled phase locking of said channel-formed adjacent columns.

* * * * *